US012282629B2

(12) United States Patent
Gao et al.

(10) Patent No.: US 12,282,629 B2
(45) Date of Patent: Apr. 22, 2025

(54) TOUCH SCANNING METHOD AND DISPLAY MODULE

(71) Applicant: GUANGDONG OPPO MOBILE TELECOMMUNICATIONS CORP., LTD., Guangdong (CN)

(72) Inventors: Yankai Gao, Guangdong (CN); Zhijia Cui, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 45 days.

(21) Appl. No.: 18/321,761

(22) Filed: May 22, 2023

(65) Prior Publication Data
US 2023/0297190 A1 Sep. 21, 2023

Related U.S. Application Data

(63) Continuation of application No. PCT/CN2021/123572, filed on Oct. 13, 2021.

(30) Foreign Application Priority Data

Nov. 24, 2020 (CN) .......................... 202011329400.9

(51) Int. Cl.
*G09G 3/32* (2016.01)
*G06F 3/041* (2006.01)
(Continued)

(52) U.S. Cl.
CPC ....... *G06F 3/04184* (2019.05); *G09G 3/3208* (2013.01); *G06F 3/0416* (2013.01);
(Continued)

(58) Field of Classification Search
CPC . G06F 3/04184; G06F 3/0416; G09G 3/2096; G09G 3/3208; G09G 3/3666;
(Continued)

(56) References Cited

U.S. PATENT DOCUMENTS

2012/0200524 A1* 8/2012 Vallis .................... G06F 3/0446
324/613
2012/0206383 A1* 8/2012 Ha ........................ G06F 3/0412
345/173
(Continued)

FOREIGN PATENT DOCUMENTS

CN 104850270 8/2015
CN 105096833 11/2015
(Continued)

OTHER PUBLICATIONS

CNIPA, First Office Action for CN Application No. 202011329400.9, Jul. 22, 2023.
(Continued)

*Primary Examiner* — Adam J Snyder
(74) *Attorney, Agent, or Firm* — Hodgson Russ LLP

(57) ABSTRACT

A touch scanning method is used for a TPIC chip and includes: receiving a emission synchronization signal sent by a DDIC chip, the light emission synchronization signal being synchronized with an EM signal controlled by the DDIC chip; and by taking the emission synchronization signal as a synchronization reference, performing continuous touch scanning according to a touch scanning frequency, where a time point of the touch scanning is aligned with a time point at which the emission synchronization signal is received. The emission synchronization signal sent by the DDIC chip is synchronized with the EM signal, and the EM signal is stable, therefore upon the receipt of the emission synchronization signal, the TPIC chip can perform continuous touch scanning with the emission synchronization signal as the synchronization reference according to a stable touch scanning frequency, thereby facilitating the improvement of the identification rate and accuracy for a touch operation.

14 Claims, 10 Drawing Sheets

(51) Int. Cl.
*G09G 3/3208* (2016.01)
*G09G 3/20* (2006.01)
*G09G 3/36* (2006.01)
*H10K 59/12* (2023.01)
*H10K 59/40* (2023.01)

(52) U.S. Cl.
CPC ......... *G09G 3/2096* (2013.01); *G09G 3/3666* (2013.01); *G09G 2310/08* (2013.01); *G09G 2330/021* (2013.01); *G09G 2340/0435* (2013.01); *G09G 2354/00* (2013.01); *H10K 59/12* (2023.02); *H10K 59/40* (2023.02)

(58) Field of Classification Search
CPC ......... G09G 2310/08; G09G 2330/021; G09G 2340/0435; G09G 2354/00; H10K 59/12; H10K 59/40
See application file for complete search history.

(56) References Cited

U.S. PATENT DOCUMENTS

| | | | |
|---|---|---|---|
| 2014/0062899 A1* | 3/2014 | Lee | G06F 3/0446 345/173 |
| 2014/0253502 A1 | 9/2014 | Cho et al. | |
| 2015/0370371 A1* | 12/2015 | Azumi | G06F 3/0445 345/174 |
| 2016/0092010 A1 | 3/2016 | Agarwal et al. | |
| 2016/0253021 A1* | 9/2016 | Syu | G06F 3/041 345/174 |
| 2020/0092516 A1* | 3/2020 | Moon | G06F 3/04166 |
| 2022/0253267 A1* | 8/2022 | Kono | G06F 3/0445 |

FOREIGN PATENT DOCUMENTS

| | | |
|---|---|---|
| CN | 105185318 | 12/2015 |
| CN | 107016960 | 8/2017 |
| CN | 107818772 | 3/2018 |
| CN | 109324717 | 2/2019 |
| CN | 109920384 | 6/2019 |
| CN | 111273814 | 6/2020 |
| CN | 111919193 A | 11/2020 |

OTHER PUBLICATIONS

WIPO, International Search Report and Written Opinion for PCT/CN2021/123572, Jan. 14, 2022.
CNIPA, Notification to Grant Patent Right for Invention for CN Application No. 202011329400.9, Apr. 11, 2024.
EPO, Extended European Search Report for EP Application No. 21896600.0, Apr. 26, 2024.

* cited by examiner

TOUCH SCANNING METHOD AND DISPLAY MODULE

CROSS-REFERENCE TO RELATED APPLICATIONS

The present disclosure is a continuation of International Application No. PCT/CN2021/123572, filed Oct. 13, 2021, which claims priority to Chinese Patent Application No. 202011329400.9, filed Nov. 24, 2020, the entire disclosures of which are incorporated herein by reference.

TECHNICAL FIELD

The present disclosure relates to the field of display technologies, and more particular, to a touch scanning method and a display module.

BACKGROUND

A display module with touch and display functions is usually provided with a display driver integrated circuit (DDIC) chip and a touch panel driver integrated circuit (TPIC) chip. The DDIC chip is used to drive a display panel to display images, and the TPIC chip is used to collect touch operation signals on the display panel.

For organic light-emitting diode (OLED) display module, when the DDIC chip drives the display panel to scan images and emit light, it will cause signal interference to the TPIC chip. In order to eliminate the signal interference, the TPIC chip and the DDIC chip need frame synchronization to avoid the signal interference from the DDIC chip to the TPIC chip. In the related art, the TPIC chip uses a vertical synchronization signal (Vertical sync, Vsync) reported by the DDIC chip as a synchronization reference to perform touch scanning.

SUMMARY

Embodiments of the present disclosure provide a touch scanning method, a TPIC chip, a DDIC chip, and a module. The technical solutions are as follows.

In one aspect, the embodiment of the present disclosure provides a touch scanning method, implemented to a TPIC chip of a display screen, the method includes:
  receiving an emission synchronization signal sent by a DDIC chip, the emission synchronization signal being synchronized with an emission (EM) signal controlled by the DDIC chip; and
  performing continuous touch scanning according to a touch scanning frequency with the emission synchronization signal as a synchronization reference, a time point of the touch scanning being aligned with a time point of the emission synchronization signal being received.

In another aspect, the embodiment of the present disclosure provides a touch scanning method, implemented to a DDIC chip of a display screen, the method includes:
  sending an emission synchronization signal to a TPIC chip in a working state, the emission synchronization signal being synchronized with an EM signal, and the TPIC chip being configured to perform continuous touch scanning according to a touch scanning frequency with the emission synchronization signal as a synchronization reference.

In another aspect, the embodiment of the present disclosure provides a TPIC chip, applied to a display screen, the TPIC chip is configured to:
  receive an emission synchronization signal sent by a DDIC chip, the emission synchronization signal being synchronized with an EM signal controlled by the DDIC chip; and
  perform continuous touch scanning according to a touch scanning frequency with the emission synchronization signal as a synchronization reference, a time point of the touch scanning being aligned with a time point of the emission synchronization signal being received.

In another aspect, the embodiment of the present disclosure provides a DDIC chip, applied to a display screen, the DDIC chip is configured to:
  send an emission synchronization signal to a TPIC chip in a working state, the emission synchronization signal being synchronized with an EM signal, and the TPIC chip is configured to perform continuously touch scanning according to a touch scanning frequency with the emission synchronization signal as a synchronization reference.

In another aspect, the embodiment of the present disclosure provides a display module, which includes a display screen, a DDIC chip, and a TPIC chip. The DDIC chip is electrically connected to the TPIC chip, and the TPIC chip is configured to implement the touch scanning method for the TPIC chip as described above. The DDIC chip is configured to implement the touch scanning method for the DDIC chip as described above.

In another aspect, the embodiment of the present disclosure provides a terminal, which includes an application processor (AP), a display screen, a DDIC chip, and a TPIC chip. The AP is electrically connected to the DDIC chip and the TPIC chip, individually. The TPIC chip is configured to implement the touch scanning method for the TPIC chip as described above, and the DDIC chip is configured to implement the touch scanning method for the DDIC chip as described above.

DETAILED DESCRIPTION OF EMBODIMENTS

Figure 1:
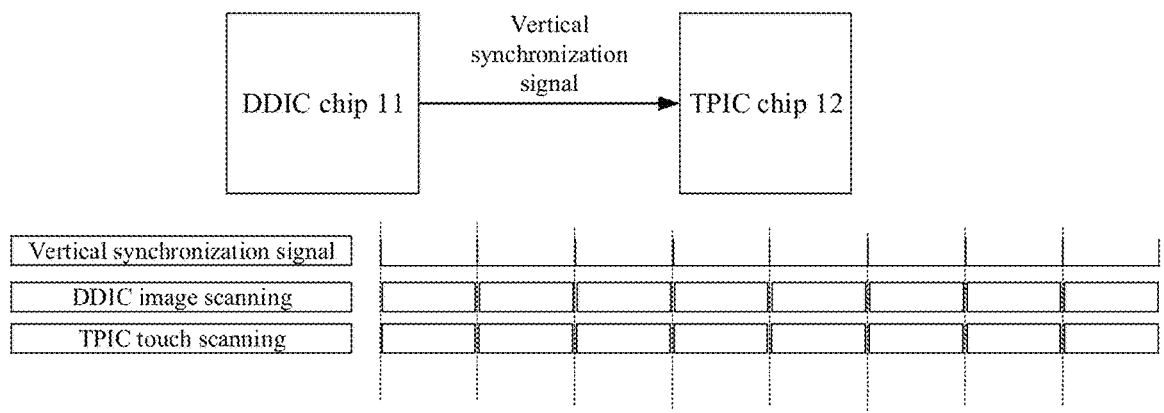
FIG. 1 illustrates a schematic diagram of a touch scanning process performed by a TPIC chip based on a vertical synchronization signal in the related art.

In order to make the purpose, technical schemes and advantages of the present disclosure clearer, embodiments of the present disclosure will be further described in detail with the attached drawings.

In this paper, "multiple" refers to two or more. "and/or", which describes a relationship of related objects, means that there can be three kinds of relationships, for example, A and/or B, which can mean that A exists alone, A and B exist together, and B exists alone. The character "/" generally indicates that the related objects before and after is an "or" relationship.

For the convenience of understanding, terms involved in the embodiments of the present disclosure will be explained first.

EM frequency: an EM signal is a panel row switch signal, which is configured to control whether pixels in a current row emit light. Accordingly, the EM frequency is a reporting frequency for generating the EM signal. In general, the EM frequency is an integer multiple of a Gate frequency, that is, multiple switching-on and switching-off of EM are performed in one frame of Gate. For example, when the Gate frequency is 60 Hz, the EM frequency is 240 Hz.

Adaptive dynamic frame rate (ADFR): a display frequency conversion technology automatically realized by a DDIC chip in a frequency conversion range is called as ADFR.

While waiting for an application processor (AP) to send image data, the DDIC chip automatically reduces a refresh rate of a display screen through an automatic delay mechanism of vertical front porch (VFP) when a rendering speed of the AP is too slow, thus realizing the adaptive matching between the refresh rate of the display screen and the rendering speed of the AP and reducing the power consumption of the display screen. In addition, when the rendering speed of the AP is increased, the refresh rate of the display screen is automatically increased to improve the smoothness of the screen display.

According to a frequency conversion accuracy, ADFR can be divided into low-precision ADFR and high-precision ADFR. The low-precision ADFR is performed in units of frames, and the DDIC chip reports a tearing effect (TE) signal to the AP according to a basic refresh rate (such as 120 Hz). When the AP detects a rising edge of the TE signal, it sends prepared image frame data to the DDIC chip, and the DDIC chip performs image scanning and frame compensation. While the high-precision ADFR is performed in the unit of an EM period of the display screen (one frame can include multiple Emission). The DDIC chip can report the TE signal to the AP according to the EM frequency (integer multiple of the basic refresh rate). When the AP detects a rising edge of the TE signal, it sends the prepared image frame data to the DDIC chip, and the DDIC chip performs image scanning. Because the high-precision ADFR reports the TE signal more frequently than the low-precision ADFR, it can improve the flexibility of frequency conversion process and reduce the frame delay and jam.

In order to reduce the signal interference caused by the DDIC chip in the display module to control the display screen to scan images and emit light, the TPIC chip needs to maintain a strict frame synchronization relationship with the DDIC chip. In the related art, the DDIC chip transmits a vertical synchronization signal used for frame synchronization to the TPIC chip, and the TPIC chip uses the vertical synchronization signal as a synchronization reference to perform touch scanning, thus reducing the signal interference of the DDIC chip.

As illustrated in FIG. 1, the DDIC chip 11 outputs a vertical synchronization signal to the TPIC chip 12 during the image scanning, and the TPIC chip 12 performs touch scanning based on the vertical synchronization signal.

Apparently, when the vertical synchronization signal output by the DDIC chip is stable (that is, an interval between vertical synchronization signals is unchanged), the TPIC chip scans at a stable touch scanning frequency.

However, when the DDIC chip realizes the high-precision ADFR, because the high-precision ADFR breaks the frame limit and performs frequency conversion in the unit of EM signal, the vertical synchronization signal output by the DDIC chip will no longer be stable (that is, the interval between vertical synchronization signals is changed). Accordingly, when the TPIC chip continues to perform touch scanning with the vertical synchronization signal as synchronization, the touch scanning also fluctuates, resulting in a problem that some touch operations cannot be recognized, which seriously affects the touch experience.

Figure 2:
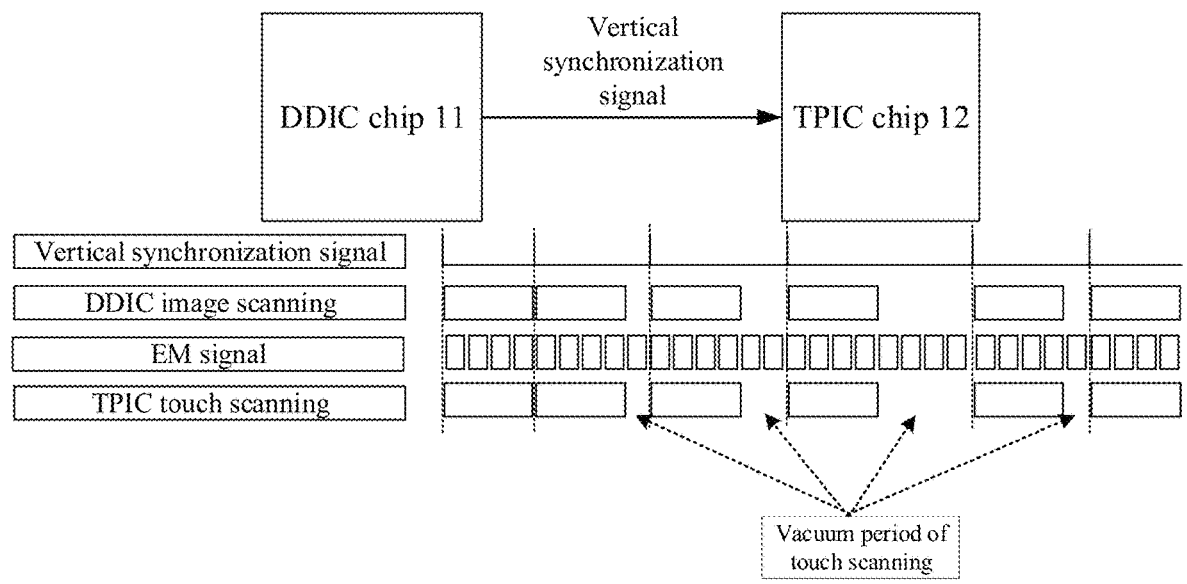
FIG. 2 illustrates a schematic diagram of a touch scanning process performed by a TPIC chip based on a vertical synchronization signal in an adaptive dynamic frame rate process.

As illustrated in FIG. 2, when the DDIC chip 11 supports the high-precision ADFR, the frequency conversion is performed in the unit of EM signal, and when an image drawing rate of the AP is decreased, the interval between the vertical synchronization signals output by the DDIC chip is increased; When the image drawing rate of AP is increased, the interval between the vertical synchronization signals output by the DDIC chip is decreased, resulting in the change of the interval between the vertical synchronization signals. If the TPIC chip 12 continues to perform touch scanning based on the vertical synchronization signal output by the DDIC chip 11, there is a vacuum period of touch scanning (that is, a time period is from a time when the DDIC completes image scanning to a next vertical synchronization signal). When the user performs touch operation during the vacuum period of touch scanning, it will cause the problem that the touch operation is unresponsive.

In order to ensure that the TPIC chip can perform stable and continuous touch scanning under the condition that the DDIC chip supports ADFR, and to avoid the problem that the touch operation is unresponsive during the vacuum period of touch scanning, in the embodiment of the present disclosure, by changing a synchronization mode between the DDIC chip and the TPIC chip, the DDIC chip outputs, based on the stable EM signal during the ADFR process, an emission synchronization signal (EMission Sync, EMsync) which is synchronized with an EM signal, thus the TPIC chip can perform continuous touch scanning according to a stable touch scanning frequency with the stable emission synchronization signal as the reference, thus eliminating the vacuum period of touch scanning generated when the touch scanning is based on the vertical synchronization signal, and ensuring the normal response of the TPIC chip to the touch operation during the ADFR process. The following is a description using some embodiments.

A touch scanning method, implemented to a TPIC chip of a display screen according to an embodiment of the disclosure, includes:

receiving an emission synchronization signal sent by a DDIC chip, where the emission synchronization signal is synchronized with an EM signal controlled by the DDIC chip;

performing continuous touch scanning according to a touch scanning frequency with the emission synchronization signal as a synchronization reference, where a time point of the touch scanning is aligned with a time point of the emission synchronization signal being received.

In some embodiments, after the performing continuous touch scanning according to a touch scanning frequency, the method further includes:

filtering touch signals collected in a process of the touch scanning.

In some embodiments, the method further includes:

receiving a vertical synchronization signal sent by the DDIC chip.

The performing continuous touch scanning according to a touch scanning frequency with the emission synchronization signal as a synchronization reference, includes:

determining an image scanning interval and a non-image scanning interval of the DDIC chip based on the vertical synchronization signal; and performing the continuous touch scanning according to the touch scanning frequency with the emission synchronization signal as the synchronization reference, and obtaining a first touch signal in the image scanning interval and a second touch signal in the non-image scanning interval.

The filtering touch signals collected in a process of the touch scanning process, includes:

filtering the first touch signal and the second touch signal.

In some embodiments, the determining an image scanning interval and a non-image scanning interval of the DDIC chip based on the vertical synchronization signal, includes:

determining an image scanning duration based on a refresh rate of the display screen;

determining a time interval of the image scanning duration after a current vertical synchronization signal as the image scanning interval; and determining a time interval between an end time of the image scanning interval and a next vertical synchronization signal as the non-image scanning interval.

In some embodiments, an interference of the DDIC chip on the TPIC chip within the image scanning interval is higher than that of the DDIC chip on the TPIC chip within the non-image scanning interval.

The filtering the first touch signal and the second touch signal, includes:

filtering the first touch signal through a first filtering algorithm, and filtering the second touch signal through a second filtering algorithm, where the first filtering algorithm is different from the second filtering algorithm.

In some embodiments, the filtering touch signals collected in a process of the touch scanning, includes:

filtering the touch signals collected in the process of the touch scanning through a preset filtering algorithm.

In some embodiments, the touch scanning frequency is 1/k of an EM frequency, and the touch scanning frequency is greater than or equal to a refresh rate of the display screen, where k is a positive integer.

The touch scanning frequency is an integer multiple of the refresh rate of the display screen, or the touch scanning frequency is a non-integer multiple of the refresh rate of the display screen.

In some embodiments, the method is implemented to a TPIC chip of an OLED display screen.

In some embodiments, the method is implemented to a TPIC chip of a display screen in a mobile terminal.

In some embodiments, a method is implemented to a DDIC chip of a display screen, and the method includes:

sending an emission synchronization signal to a TPIC chip in a working state, where the emission synchronization signal is synchronized with an EM signal, and the TPIC chip is configured to perform continuous touch scanning according to a touch scanning frequency with the emission synchronization signal as a synchronization reference.

In some embodiments, the method further includes:

sending a vertical synchronization signal to the TPIC chip, where the TPIC chip is configured to determine an image scanning interval and a non-image scanning interval of the DDIC chip based on the vertical synchronization signal, and filter a first touch signal in the image scanning interval and a second touch signal in the non-image scanning interval.

In some embodiments, the method is implemented to a DDIC chip of an OLED display screen.

In some embodiments, the method is implemented to a DDIC chip of a display screen of a mobile terminal.

Figure 3:
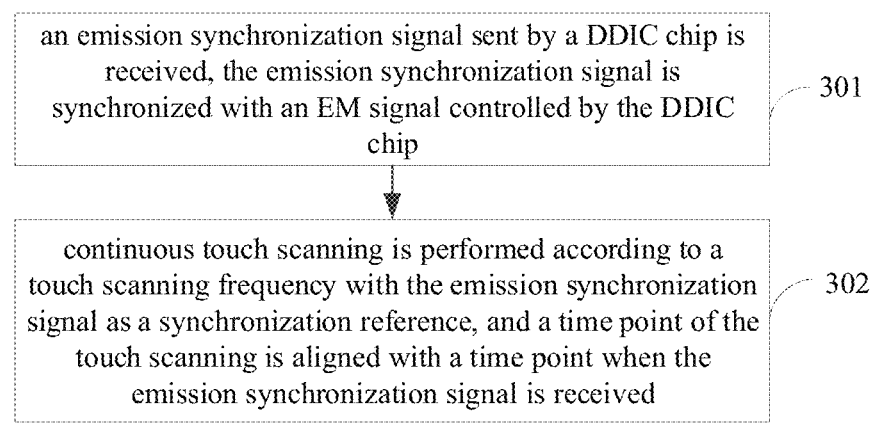
FIG. 3 illustrates a flowchart of a touch scanning method according to some embodiments of the present disclosure.

As illustrated in FIG. 3, FIG. 3 illustrates a flowchart of a touch scanning method according to some embodiments of the present disclosure. The embodiment takes the application of this method to a TPIC chip of a display screen as an example. The method includes the following blocks.

At block 301: an emission synchronization signal sent by a DDIC chip is received, the emission synchronization signal is synchronized with an EM signal controlled by the DDIC chip.

In some embodiments, both the DDIC chip and the TPIC chip are applied in the OLED display screen. In a working state, the DDIC chip generates an emission synchronization signal synchronized with the EM signal and sends the emission synchronization signal to the TPIC chip. Because a frequency of the EM signal generated by the DDIC chip remains constant (not affected by ADFR), the frequency of the emission synchronization signal received by the TPIC chip also remains constant. In some embodiment, when the frequency of the EM signal of the DDIC chip is 360 Hz, the frequency of the emission synchronization signal received by the TPIC chip is 360 Hz.

In some embodiments, the DDIC chip can continue to send a vertical synchronization signal to the TPIC chip, and correspondingly, the TPIC chip can also receive the vertical synchronization signal sent by the DDIC chip when receiving the emission synchronization signal, but the TPIC chip will no longer perform touch scanning with the vertical synchronization signal as the synchronization reference.

In some embodiments, the DDIC chip can stop to send the vertical synchronization signal to the TPIC chip.

Figure 4:
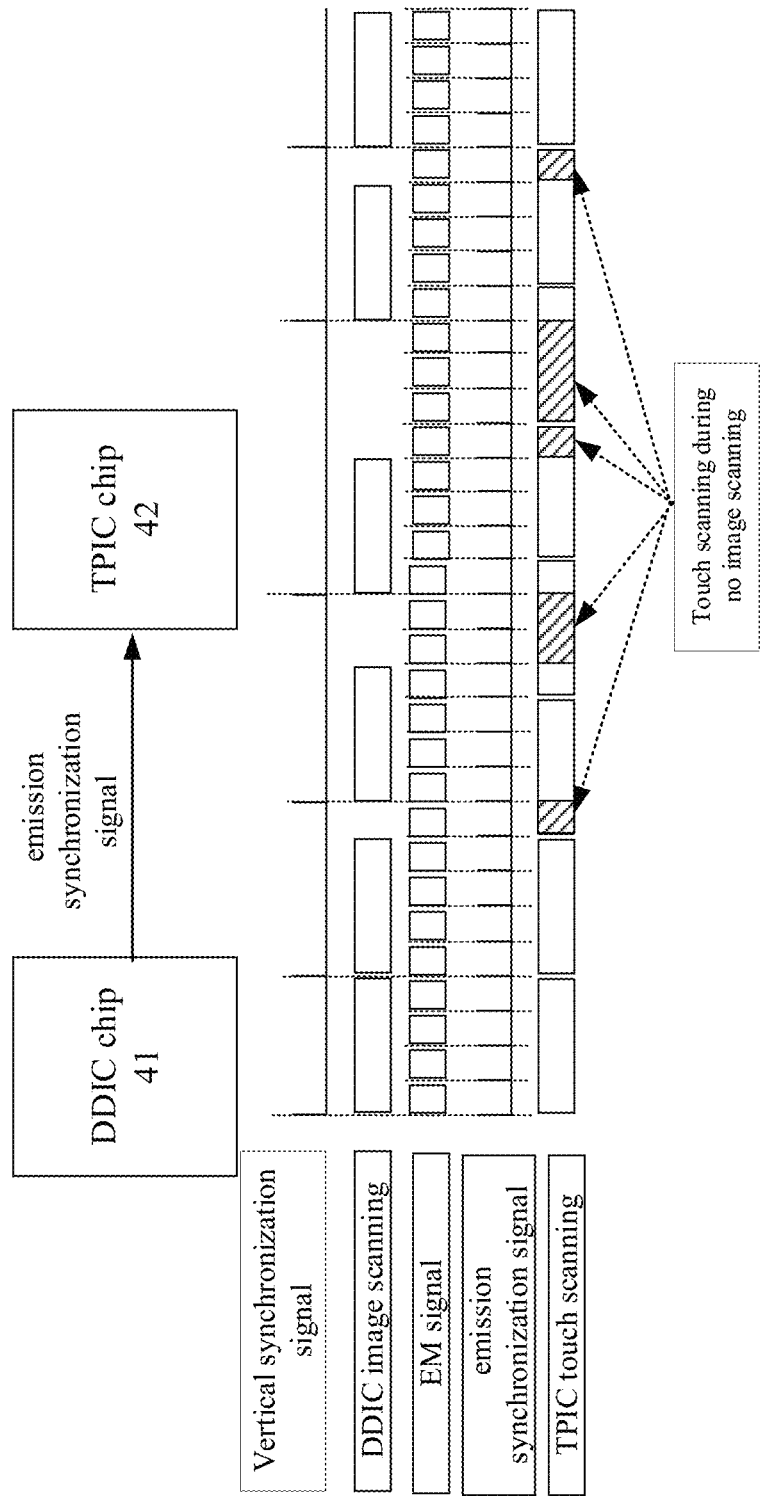
FIG. 4 illustrates a schematic diagram of a touch scanning process performed by a TPIC chip based on an emission synchronization signal according to some embodiments of the present disclosure.

In some embodiments, as illustrated in FIG. 4, the DDIC chip 41 sends an emission synchronization signal (frequency is 480 Hz) synchronized with an EM signal to the TPIC chip 42, and at the same time, the DDIC chip 41 continues to send a vertical synchronization signal to the TPIC chip 42.

At block 302, continuous touch scanning is performed according to a touch scanning frequency with the emission synchronization signal as a synchronization reference, a time point of the touch scanning is aligned with a time point when the emission synchronization signal is received.

In the embodiment of the present disclosure, a synchronization mode between the DDIC chip and the TPIC chip has changed, and the two chips are no longer limited by frame synchronization. Correspondingly, the TPIC chip no longer takes the vertical synchronization signal as the synchronization reference, but takes the emission synchronization signal as the reference for touch scanning, and the time point when the TPIC chip performs touch scanning according to the touch scanning frequency is aligned with the time point when the emission synchronization signal is received, that is, the TPIC chip starts touch scanning according to the received emission synchronization signal.

In some embodiments, the TPIC chip performs touch scanning according to a fixed touch scanning frequency, or the TPIC chip can dynamically adjust the touch scanning frequency and perform touch scanning according to the current application scenario.

In some embodiments, in any application scenario, the TPIC chip performs touch scanning according to the touch scanning frequency of 120 Hz; Or, if the current application scenario has a low demand for touch (such as video playing, e-book reading and other scenarios), the TPIC chip performs touch scanning according to the touch scanning frequency of 120 Hz, if the current application scenario has a high demand for touch (such as games or drawings), the TPIC chip performs touch scanning according to the touch scanning frequency of 240 Hz.

Because the emission synchronization signal is stable and continuous, when the TPIC chip performs touch scanning with the emission synchronization signal as the synchronization reference, it can keep touch scanning even during the period of no image scanning, and there will be no vacuum period of touch scanning, thus realizing stable and continuous touch scanning.

In some embodiments, as illustrated in FIG. 4, when the TPIC chip performs touch scanning with a touch scanning frequency of 120 Hz by using the emission synchronization signal as the synchronization reference, it can perform touch scanning in image scanning period. In addition, the touch scanning can be maintained even during the non-image scanning period (shaded areas in the figure), and the touch scanning with stable frequency and continuity can be realized.

To sum up, in the embodiment of the present disclosure, in the scene of adaptive dynamic frame rate of DDIC chip, compared with the related art when the TPIC chip performs touch scanning by taking the vertical synchronization signal sent by the DDIC chip as the synchronization reference, the interval between the vertical synchronization signals sent by the DDIC chip is change, which leads to the unstable touch scanning frequency of the TPIC chip, and thus the problem that the touch operation cannot be recognized. In the embodiment of the present disclosure, since the emission synchronization signal sent by the DDIC chip is synchronized with the EM signal and the EM signal is stable, after receiving the emission synchronization signal, the TPIC chip can perform continuous touch scanning according to the stable touch scanning frequency, which is helpful to improve the recognition rate and accuracy of touch operation.

In some embodiments, in order to eliminate the signal interference of the DDIC chip to the TPIC chip, after the touch scanning, the TPIC chip filters touch signals collected during the touch scanning.

In order to reduce the signal interference of DDIC chip to TPIC chip and improve the accuracy of touch operation, the TPIC chip needs to filter the touch signal collected in the process of touch scanning through a filtering algorithm to filter out the interference signal generated by the work of the DDIC chip in the touch signal, and then report and respond to the filtered touch signal.

In some embodiments, as illustrated in FIG. 4, the TPIC chip filters the touch signal in the touch scanning period (8.3 ms).

In some embodiments, the TPIC chip can uniformly filter the touch signals collected in the touch scanning process through a preset filtering algorithm; In another some embodiments, the TPIC chip can filter the touch signals with different interference degrees through different filtering algorithms because the signal interference degrees of the TPIC chip are different during the touch scanning process. The following embodiments will detail the filtering process.

As can be seen from the embodiment illustrated in FIG. 4, when the TPIC chip performs touch scanning, a part of the touch scanning is performed synchronously with the image scanning of the DDIC chip, and the other part of the touch scanning is performed separately during the vacuum period of the image scanning. When the touch scanning is performed in the image scanning process of the DDIC chip, because the DDIC chip will generate high-frequency line-by-line scanning signals when scanning the image line by line, the signal interference caused by the DDIC chip to the TPIC chip is great, and in the non-image scanning process of the DDIC chip, the DDIC chip does not need to scan line by line, thus the signal interference caused to the TPIC chip is relatively small.

Therefore, in order to improve the quality of touch signal filtering, so as to improve the accuracy of touch operation, in some embodiments, the TPIC chip combines the vertical synchronization signal sent by the DDIC chip to filter the touch signals collected in an image scanning interval and a non-image scanning interval through different filtering algorithms. The following is a description using embodiments.

Figure 5:
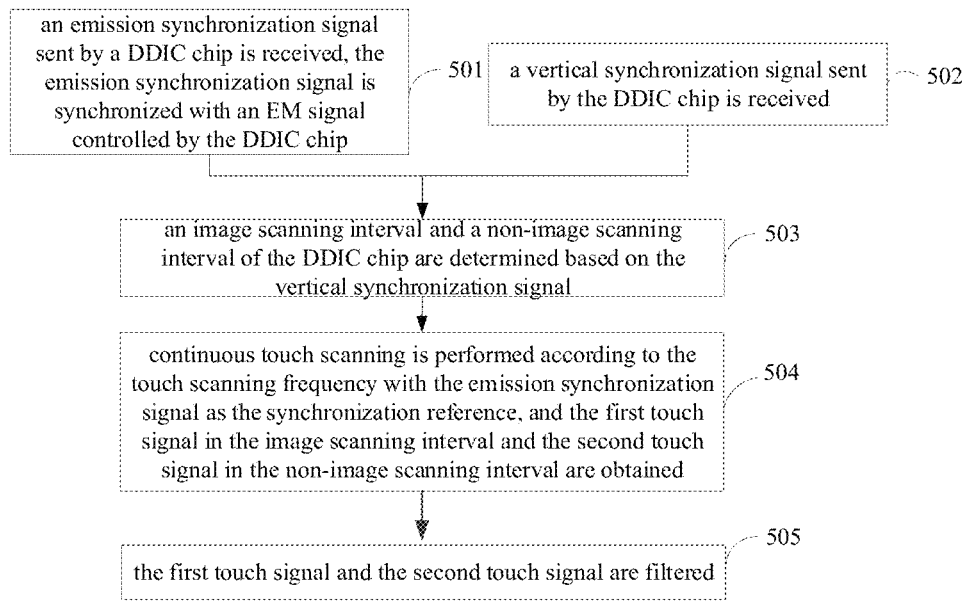
FIG. 5 illustrates a flowchart of a touch scanning method according to another some embodiments of the present disclosure.

As illustrated in FIG. 5, FIG. 5 illustrates a flowchart of a touch scanning method according to another some embodiments of the present disclosure. The embodiment takes the application of this method to a TPIC chip of a display screen as an example. The method includes the following blocks.

At block 501, an emission synchronization signal sent by a DDIC chip is received, the emission synchronization signal is synchronized with an EM signal controlled by the DDIC chip.

The implementation of this block can refer to the above block 301, and the details of this embodiment are not repeated here.

At block 502, a vertical synchronization signal sent by the DDIC chip is received.

Figure 6:
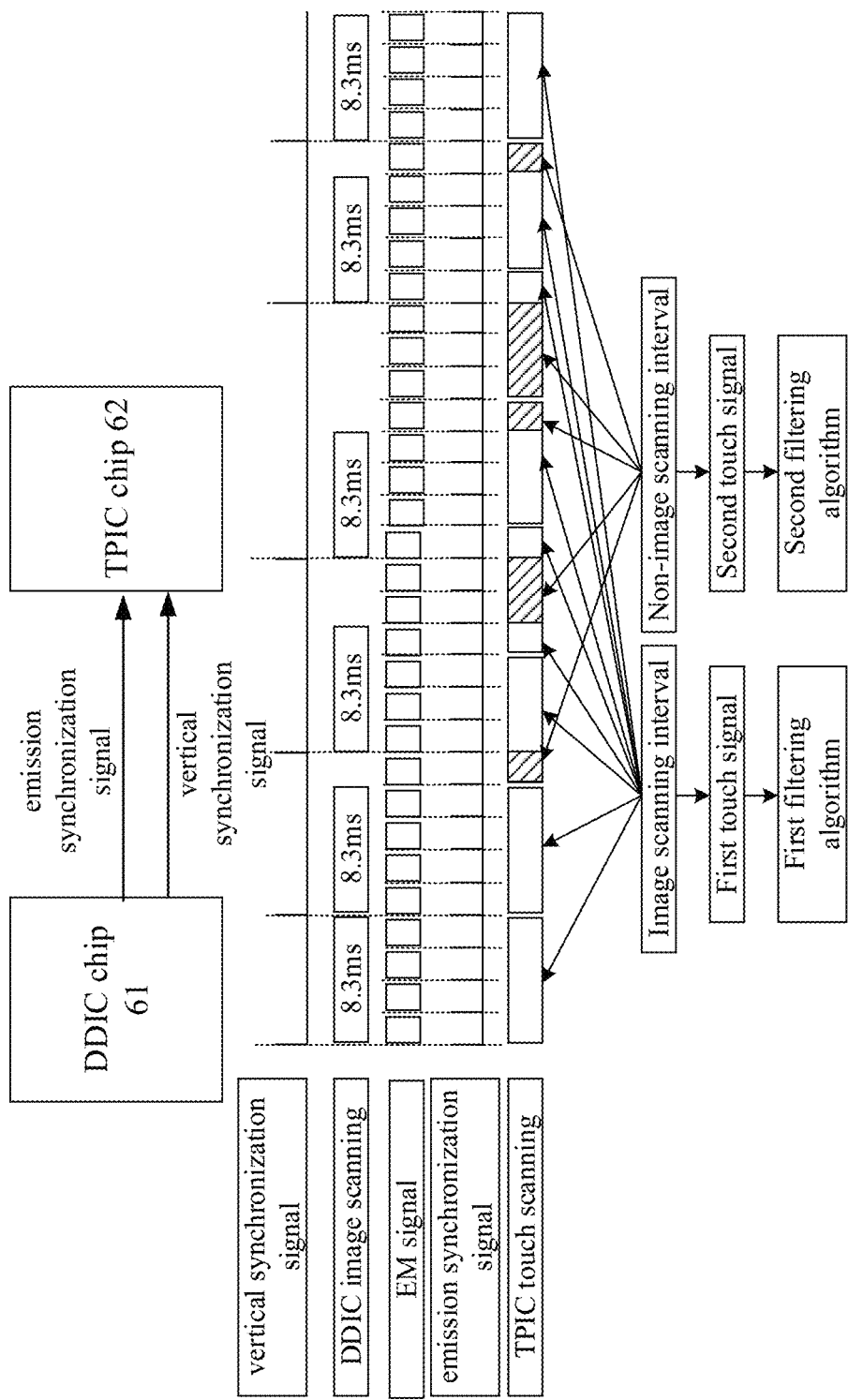
FIG. 6 illustrates a schematic diagram of a touch scanning process performed by a TPIC chip based on an emission synchronization signal according to another some embodiments of the present disclosure.

In some embodiments, as illustrated in FIG. 6, the DDIC chip 61 sends an emission synchronization signal to the TPIC chip 62, and also sends a vertical synchronization signal to the TPIC chip, which is used to indicate the start time of image scanning by the DDIC chip.

At block 503, an image scanning interval and a non-image scanning interval of the DDIC chip are determined based on the vertical synchronization signal.

In order to filter the touch signals collected under different signal interference degrees, the TPIC chip needs to determine the image scanning interval and the non-image scanning interval of the DDIC chip. The image scanning interval is a corresponding time interval when the DDIC chip performs image scanning, and the non-image scanning interval is a time interval between the completion of the image scanning by the DDIC chip and a next vertical synchronization signal.

In some embodiments, the TPIC chip determines an image scanning start time of the DDIC chip for image scanning according to the vertical synchronization signal, and determines the image scanning interval and the non-image scanning interval based on the image scanning start time and the image scanning duration of a single frame image. In some embodiments, the foregoing determining the image scanning interval and the non-image scanning interval may include the following steps.

1. The image scanning duration is determined according to a refresh rate of a display screen.

In some embodiments, when a ADFR scheme is adopted, in order to reduce the influence of the change of image scanning frequency on the parameters of the display screen, the DDIC chip needs to keep the image scanning speed unchanged, that is, the time for scanning one line unchanged, and the time for completing one frame of image scanning unchanged, only extending the vertical porch (Vporch). In some embodiments, when the refresh rate of the display screen supports 60 Hz, 90 Hz and 120 Hz, each frame of image scanning is completed within 8.3 ms (the maximum scanning time for refreshing a single frame of image).

In some embodiments, the TPIC chip determines a scanning duration of a single frame image at the highest refresh rate as the image scanning duration according to the refresh rates of the display screen.

As illustrated in FIG. 6, when the maximum refresh rate of the display screen is 120 Hz, the TPIC chip determines that the image scanning time is 8.3 ms.

2. The time interval of the image scanning duration after the current vertical synchronization signal is determined as the image scanning interval.

Since the DDIC chip scans the image when sending the vertical synchronization signal, the TPIC chip takes the time interval of the image scanning duration after the current vertical synchronization signal as the image scanning interval.

As illustrated in FIG. 6, the TPIC chip determines 8.3 ms after each vertical synchronization signal as the image scanning interval.

3. The time interval between an end time of the image scanning interval and the next vertical synchronization signal is determined as the non-image scanning interval.

Since the DDIC chip does not always scan images between two adjacent vertical synchronization signals (there is a time to wait for the AP to transmit image frame data), the TPIC chip determines the time interval from the end of the image scanning interval to the next vertical synchronization signal as the non-image scanning interval.

As illustrated in FIG. 6, the TPIC chip determines the first 2.1 ms (i.e. one EM signal) in the third touch scanning as a non-image scan interval, the middle 4.2 ms (i.e. two EM signals) in the fourth touch scanning as a non-image scan interval, the last 2.1 ms (i.e. one EM signal) in the fifth touch scanning as a non-image scan interval, the first 6.3 ms (i.e. three EM signals) in the sixth touch scanning as a non-image scan interval, and the last 2.1 ms (i.e. one EM signal) in the seventh touch scanning as a non-image scan interval.

At block 504, continuous touch scanning is performed according to the touch scanning frequency with the emission synchronization signal as the synchronization reference, and the first touch signal in the image scanning interval and the second touch signal in the non-image scanning interval are obtained.

In some embodiments, the TPIC chip performs continuous touch scanning according to the touch scanning frequency, so as to determine the touch signal collected in the image scanning interval as the first touch signal, and determine the touch signal collected in the non-image scanning interval as the second touch signal. Here, the touch scanning process based on the emission synchronization signal can refer to the above block 302, and the details of this embodiment are not repeated here.

At block 505, the first touch signal and the second touch signal are filtered.

Because the interference of DDIC chip to TPIC chip in the image scanning interval is higher than that in the non-image scanning interval, the TPIC chip performs targeted filtering processing for touch signals in different intervals.

In some embodiments, due to severe interference from the DDIC chip signal when collecting the first touch signal, and slight interference from the DDIC chip signal when collecting the second touch signal, the TPIC chip filters the first touch signal through a first filtering algorithm and the second touch signal through a second filtering algorithm. The algorithm complexity of the first filtering algorithm is higher than that of the second filtering algorithm.

In some embodiments, the first filtering algorithm is used to filter signal interference from the image scanning and the emission signal, while the second filtering algorithm is used to filter signal interference from the emission signal. The embodiment does not limit this.

As illustrated in FIG. 6, the TPIC chip uses the first filtering algorithm to filter the first touch signals collected by the first touch scanning, the second touch scanning, the last 6.3 ms of the third touch scanning, the first 2.1 ms and the last 2.1 ms of the fourth touch scanning, the first 6.3 ms of the fifth touch scanning, the last 2.1 ms of the sixth touch scanning, the first 6.3 ms of the seventh touch scanning, and the eighth touch scanning; the TPIC chip uses the second filtering algorithm to filter the second touch signals collected by the first 2.1 ms of the third touch scanning, the middle 4.1 ms of the fourth touch scanning, the last 2.1 ms of the fifth touch scanning, the first 6.3 ms of the sixth touch scanning, and the last 2.1 ms of the seventh touch scanning.

Figure 7:
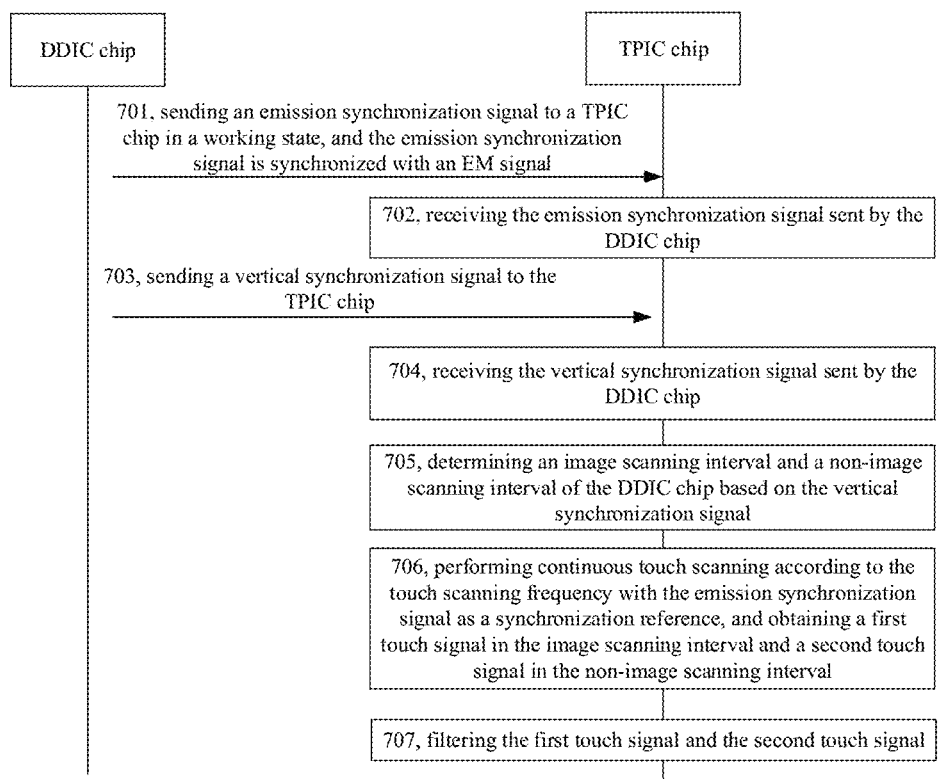
FIG. 7 illustrates a flowchart of a touch scanning method according to another some embodiments of the present disclosure.

In the process of touch scanning, an interaction process between a DDIC chip and a TPIC chip is illustrated in FIG. 7.

At block 701, the DDIC chip sends an emission synchronization signal to the TPIC chip in a working state, and the emission synchronization signal is synchronized with an EM signal.

At block 702, the TPIC chip receives the emission synchronization signal sent by the DDIC chip.

At block 703, the DDIC chip sends a vertical synchronization signal to the TPIC chip.

At block 704, the TPIC chip receives the vertical synchronization signal sent by the DDIC chip.

At block 705, the TPIC chip determines an image scanning interval and a non-image scanning interval of the DDIC chip based on the vertical synchronization signal.

At block 706, the TPIC chip performs continuous touch scanning according to the touch scanning frequency with the emission synchronization signal as a synchronization reference, and obtains a first touch signal in the image scanning interval and a second touch signal in the non-image scanning interval.

At block 707, the TPIC chip filters the first touch signal and the second touch signal.

With the method provided in the embodiment, the TPIC chip combines the vertical synchronization signal sent by the DDIC chip to determine the touch signals collected in the non-image scanning interval and the image scanning interval, and performs targeted processing on the touch signals in different scanning intervals. In some embodiments, the touch signal in the non-image scanning interval with less interference is specially processed to improve the filtering effect of the touch signal, which is helpful to improve the accuracy of touch operation.

Figure 8:
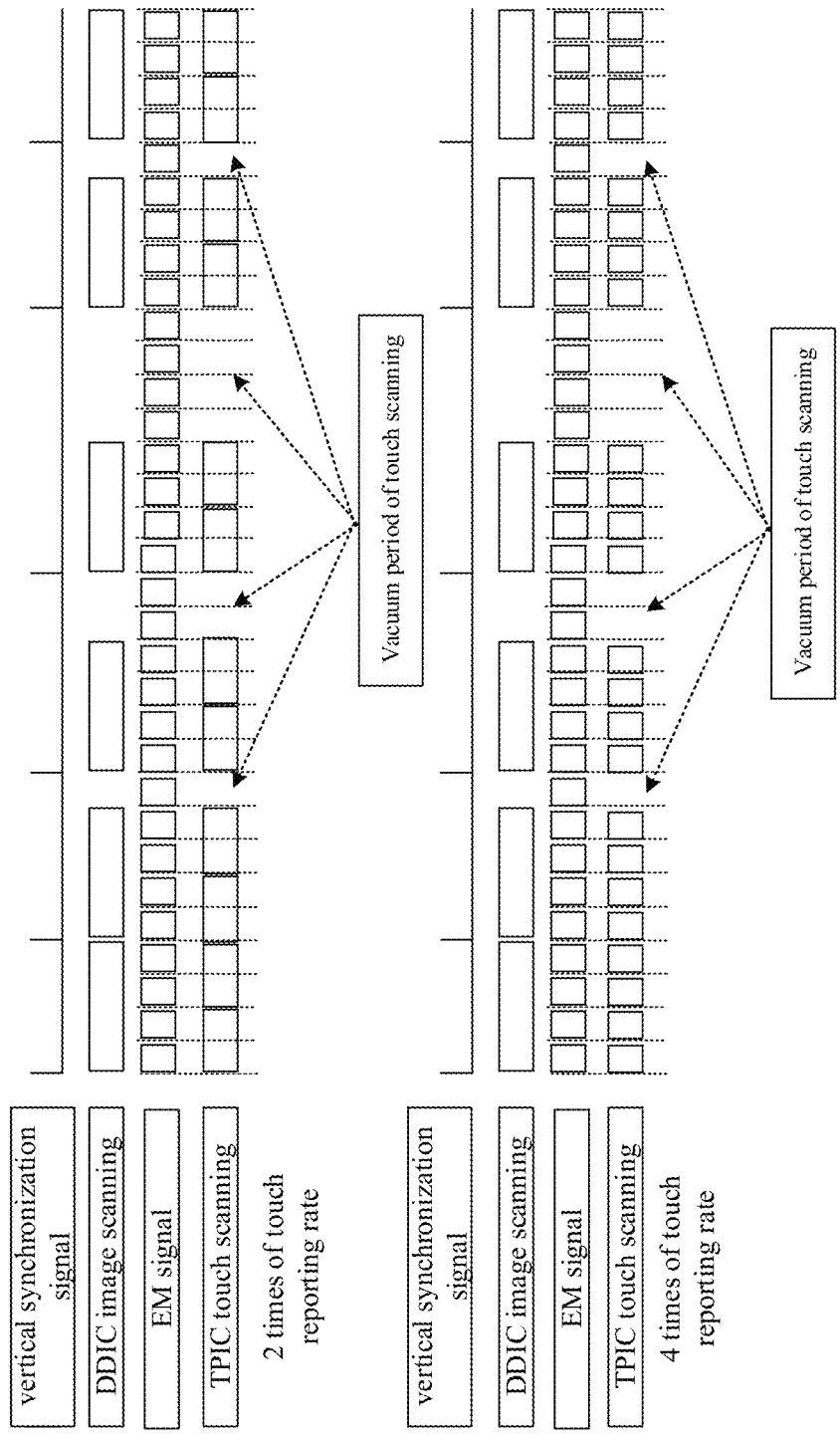
FIG. 8 illustrates a schematic diagram of a relationship between a reporting rate of a TPIC chip and a refresh rate of a display screen in the related art.

In addition, due to the strict frame synchronization relationship, the touch reporting rate of the TPIC chip (that is, the frequency of reporting detected touch signals is consistent with the touch scanning frequency) can only be an integer multiple of the refresh rate of the display screen (that is, only an integer number of touch scanning can be performed during image scanning). As illustrated in FIG. 2, the touch reporting rate of the TPIC chip is 1 time of the refresh rate of the display screen (that is, one touch scanning is performed during the image frame scanning); As illustrated in FIG. 8, the touch reporting rate of the TPIC chip is 2 times and 4 times of the refresh rate of the display screen (that is, touch scanning is performed 2 and 4 times individually during image frame scanning), and there is also the problem of the vacuum period of touch scanning.

However, by adopting the method provided by the embodiment of the present disclosure, since the synchronization between the DDIC chip and the TPIC chip is no longer in frame units, the touch scanning frequency no longer has to be an integer multiple of the refresh rate of the display screen.

In some embodiments, the touch scanning frequency is 1/k of an EM frequency, and the touch scanning frequency is greater than or equal to the refresh rate of the display screen, and k is a positive integer. Moreover, the touch scanning frequency is an integer multiple of the refresh rate of the display screen, or a non-integer multiple of the refresh rate of the display screen.

Figure 9:
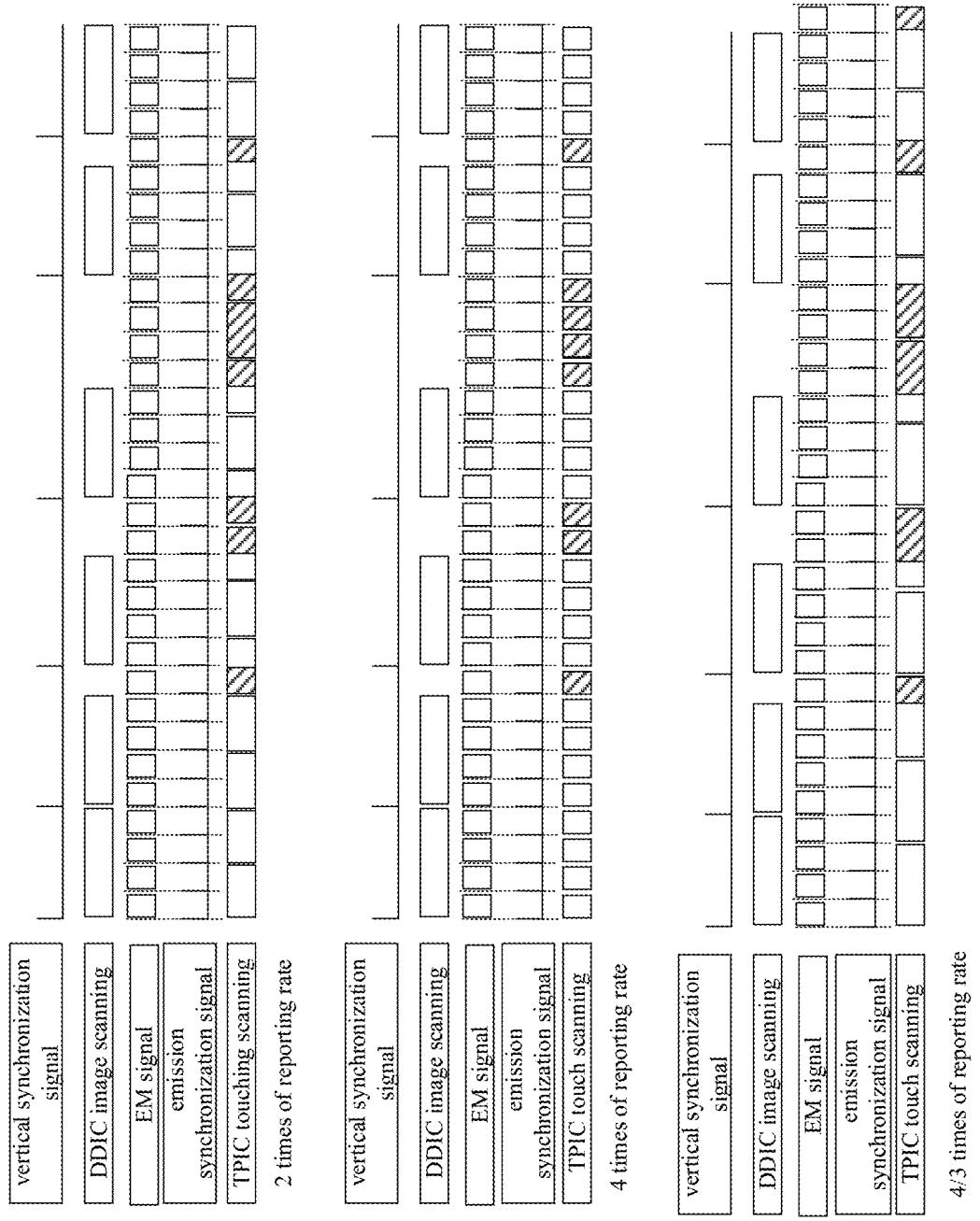
FIG. 9 illustrates a schematic diagram of a relationship between a reporting rate of a TPIC chip and a refresh rate of a display screen according to some embodiments of the present disclosure.

In some embodiments, as illustrated in FIG. 9, taking the refresh rate of the display screen as 120 Hz and the EM frequency as 480 Hz as an example, the TPIC chip can perform touch scanning at the frequency of 240 Hz (that is, ½ of the EM frequency and 2 times of the reporting rate of the refresh rate of the display screen); the TPIC chip can perform touch scanning at a frequency of 480 Hz (that is, 1/1 of the EM frequency and 4 times of the reporting rate of the refresh rate of the display screen); and the TPIC chip can perform touch scanning at the frequency of 160 Hz (that is, ⅓ of the EM frequency and 4/3 of the reporting rate of refresh rate of the display screen).

Figure 10:
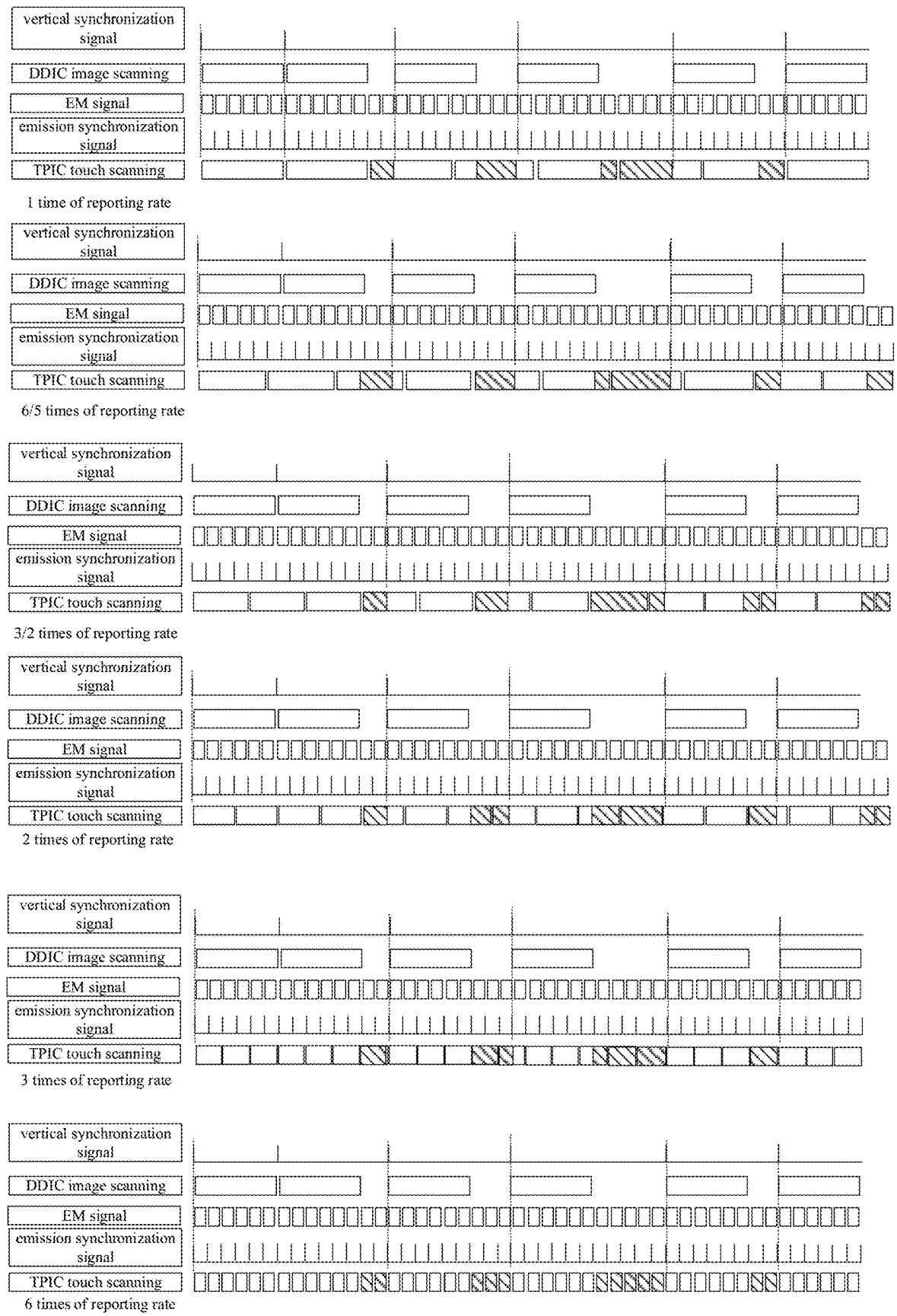
FIG. 10 illustrates a schematic diagram of a relationship between a reporting rate of a TPIC chip and a refresh rate of a display screen according to another some embodiments of the present disclosure.

In another some embodiments, as illustrated in FIG. 10, taking the refresh rate of the display screen as 120 Hz and the EM frequency as 720 Hz as an example, the TPIC chip can perform touch scanning at the frequency of 120 Hz (that is, ⅙ of the EM frequency and 1 time of the reporting rate of the refresh rate of the display screen); the TPIC chip can perform touch scanning at the frequency of 144 Hz (that is, ⅕ of the EM frequency and 6/5 times of the reporting rate of the refresh rate of the display screen); the TPIC chip can perform touch scanning at the frequency of 180 Hz (that is, ¼ of the EM frequency and 3/2 times of reporting rate of the refresh rate of the display screen); the TPIC chip can perform touch scanning at the frequency of 240 Hz (that is, ⅓ of the EM frequency and 2 times of the reporting rate of the refresh rate of the display screen); the TPIC chip can perform touch scanning at the frequency of 360 Hz (that is, ½ of the EM frequency and 3 times of the reporting rate of the refresh rate of the display screen); and the TPIC chip can perform touch scanning at the frequency of 720 Hz (that is, 1/1 of the EM frequency and 6 times of the reporting rate of the refresh rate of the display screen).

By adopting the scheme provided by the embodiment of the present disclosure, the TPIC chip can realize a non-integer multiple of the refresh rate of the display screen with the emission synchronization signal as the synchronization reference, thereby increasing the reporting rate supported by the TPIC chip and improving the flexibility of the TPIC chip in touch scanning.

In some embodiments, the method provided by the embodiments of the present disclosure is applied to a mobile terminal, that is, the DDIC chip of the display screen in the mobile terminal executes the above image display method. Since the mobile terminal is usually powered by a battery, and the battery power is limited (sensitive to power consumption), after the method provided by the embodiment of the present disclosure is applied to the mobile terminal, the TPIC chip can be matched with the DDIC chip supporting high-precision ADFR, and the power consumption of the mobile terminal (dynamic frequency conversion can reduce the power consumption of the display screen) is reduced, while the normal use of the touch function is ensured. The mobile terminal may include a smart phone, a tablet computer, a wearable device (such as a smart watch), a portable personal computer, etc. The embodiments of the present disclosure do not limit the specific types of the mobile terminal.

Of course, the method provided by the embodiments of the present disclosure can also be used for other non-battery-powered terminals, such as televisions, monitors or personal computers, and the embodiments of the present disclosure are not limited to this.

An embodiment of the present disclosure further provides a TPIC chip, applied to a display screen, and the TPIC chip is configured to:

receive an emission synchronization signal sent by a DDIC chip, where the emission synchronization signal is synchronized with an EM signal controlled by the DDIC chip;

perform continuous touch scanning according to a touch scanning frequency with the emission synchronization signal as a synchronization reference, where a time point of the touch scanning is aligned with a time point of the emission synchronization signal being received.

In some embodiments, the TPIC chip is further configured to:

filter touch signals collected in a process of the touch scanning.

In some embodiments, the TPIC chip is further configured to:

receive a vertical synchronization signal sent by the DDIC chip;

determine an image scanning interval and a non-image scanning interval of the DDIC chip based on the vertical synchronization signal;

perform the continuous touch scanning according to the touch scanning frequency with the emission synchronization signal as the synchronization reference, and obtain a first touch signal in the image scanning interval and a second touch signal in the non-image scanning interval; and filtering the first touch signal and the second touch signal.

In some embodiments, the TPIC chip is configured to:

determine an image scanning duration based on a refresh rate of the display screen;

determine a time interval of the image scanning duration after a current vertical synchronization signal as the image scanning interval;

determine a time interval between an end time of the image scanning interval and a next vertical synchronization signal as the non-image scanning interval.

In some embodiments, an interference of the DDIC chip on the TPIC chip within the image scanning interval is higher than that of the DDIC chip on the TPIC chip within the non-image scanning interval.

The TPIC chip is configured to:

filter the first touch signal through a first filtering algorithm, and filter the second touch signal through a second filtering algorithm, where the first filtering algorithm is different from the second filtering algorithm.

In some embodiments, the TPIC chip is further configured to:

filter the touch signals collected in the process of the touch scanning through a preset filtering algorithm.

In some embodiments, the touch scanning frequency is 1/k of an EM frequency, and the touch scanning frequency is greater than or equal to a refresh rate of the display screen, where k is a positive integer.

The touch scanning frequency is an integer multiple of the refresh rate of the display screen, or the touch scanning frequency is a non-integer multiple of the refresh rate of the display screen.

In some embodiments, the TPIC chip is a TPIC chip of an OLED display screen.

In some embodiments, the TPIC chip is a TPIC chip of a display screen in a mobile terminal.

An embodiment of the present disclosure further provides a DDIC chip, applied to a display screen, the DDIC chip is configured to:

send an emission synchronization signal to a TPIC chip in a working state, where the emission synchronization signal is synchronized with an EM signal, and the TPIC chip is configured to perform continuous touch scanning according to a touch scanning frequency with the emission synchronization signal as a synchronization reference.

In some embodiments, the DDIC chip is further configured to:

send a vertical synchronization signal to the TPIC chip, where the TPIC chip is configured to determine an image scanning interval and a non-image scanning interval of the DDIC chip based on the vertical synchronization signal, and filter a first touch signal in the image scanning interval and a second touch signal in the non-image scanning interval.

In some embodiments, the DDIC chip is a DDIC chip of an OLED display screen.

In some embodiments, the DDIC chip is a DDIC chip of a display screen of a mobile terminal.

The detailed processes of the above-mentioned DDIC chip and TPIC chip in realizing the touch scanning method can refer to the above-mentioned various method embodiments, and these embodiments are not repeated here.

In addition, an embodiment of the present disclosure provides a display module, the display module includes: a display screen, a DDIC chip and a TPIC chip, the DDIC chip is electrically connected with the TPIC chip, the TPIC chip is configured to implement the touch scanning method for the TPIC chip according to the above embodiments, and the DDIC chip is configured to implement the touch scanning method for the DDIC chip according to the above embodiments.

Figure 11:
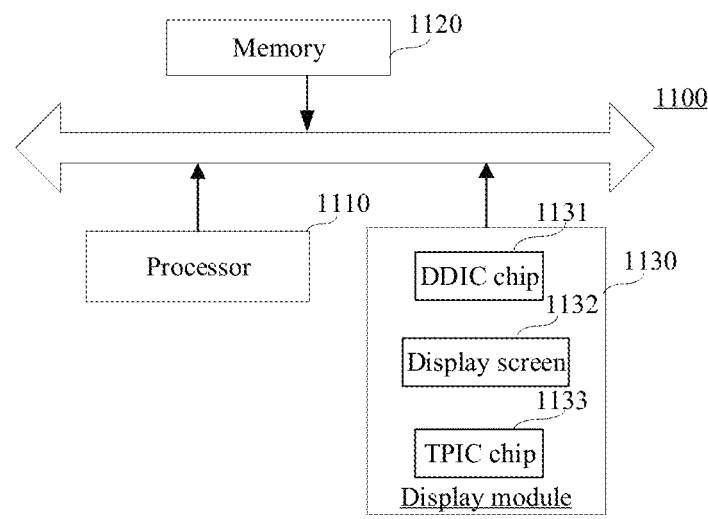
FIG. 11 illustrates a structural block diagram of a terminal according to some embodiments of the present disclosure.

As illustrated in FIG. 11, FIG. 11 illustrates a structural block diagram of a terminal 1100 provided by some embodiments of the present disclosure. The terminal 1100 may be a smart phone, a tablet computer, a notebook computer, etc. The terminal 1100 in the present disclosure may include one or more of the following components: a processor 1110, a memory 1120, and a display module 1130.

The processor 1110 may include one or more processing cores. The processor 1110 connects various parts in the whole terminal 1100 with various interfaces and lines, and executes various functions of the terminal 1100 and processes data by running or executing instructions, programs, code sets or instruction sets stored in the memory 1120 and calling data stored in the memory 1120. In some embodiments, the processor 1110 may be implemented in at least one hardware form of digital signal processing (DSP), field-programmable gate array (FPGA) and programmable logic array (PLA). The processor 1110 may be integrated with one or more combinations of central processing unit (CPU), graphics processing unit (GPU), neural-network processing unit (NPU) and modem. The CPU mainly deals with operating system, user interface and application programs. The GPU is used to render and draw contents that need to be displayed by the touch screen module 1130. The NPU is used to realize artificial intelligence (AI) function; Modems are used to handle wireless communication. It can be understood that the above modems can also be realized by a single chip without being integrated into the processor 1110.

The memory 1120 may include a random access memory (RAM) or a read-only memory (ROM). In some embodiments, the memory 1120 includes a non-transitory computer-readable storage medium. The memory 1120 can be used to store instructions, programs, codes, code sets or instruction sets. The memory 1120 may include a storage program area and a storage data area, the storage program area may store instructions for implementing an operating system, instructions for at least one function (such as a touch function, a sound playing function, an image playing function, etc.), instructions for implementing various method embodiments of the present disclosure, etc. The storage data area may store data created according to the use of the terminal 1100 (such as audio data, phone book) and the like.

The display module 1130 is a display component for displaying images, and is usually arranged on a front panel of the terminal 1100. The display module 1130 can be designed as a full screen, a curved screen, a special screen, a double-sided screen or a folding screen. The display module 1130 can also be designed as a combination of a full screen and a curved screen, and a combination of a special screen and a curved screen, which is not limited in the embodiments.

In the embodiment, the display module 1130 includes a DDIC chip 1131, a display screen 1132 (panel) and a TPIC chip 1133. In some embodiments, the display screen 1132 is an OLED display screen, which may be a low temperature poly-silicon (LTPS) AMOLED display screen or a low temperature polycrystalline oxide (LTPO) AMOLED display screen.

The DDIC chip 1131 is configured to drive the display screen 1132 to display images, and the DDIC chip 1131 is configured to realize the methods on the DDIC chip side in the above embodiments. In addition, the DDIC chip 1131 is connected with the processor 1110 through the MIPI interface for receiving the image data and instructions sent by the processor 1110.

The TPIC chip 1133 is configured to drive the display screen 1132 to receive a touch operation, which is triggered by the user using any suitable object such as a finger or a touch pen. In the embodiment of the present disclosure, the TPIC chip 1133 is also electrically connected with the DDIC chip 1131, and is configured to receive synchronization signals (including vertical synchronization signals and emission synchronization signals) sent by the DDIC chip 1131, so as to realize the methods on the TPIC chip side in the above embodiments. In addition, the TPIC chip 1133 is also connected with the processor 1110 through the MIPI interface for reporting the touch signal to the processor 1110.

In addition, those skilled in the art can understand that the structure of the terminal 1100 illustrated in the above drawing does not constitute a limitation to the terminal 1100, and the terminal may include more or less components than those illustrated, or combine some components, or have different component arrangements. For example, the terminal 1100 further includes a microphone, a speaker, a radio frequency circuit, an input unit, a sensor, an audio circuit, a wireless fidelity (WiFi) module, a power supply, a Bluetooth module and other components, which are not described here.

Those skilled in the art should realize that in one or more of the above embodiments, the functions described in the embodiments of the present disclosure can be realized by hardware, software, firmware or any combination thereof. When implemented in software, these functions can be stored in a computer-readable medium or transmitted as one or more instructions or codes on a computer-readable medium. The computer-readable media includes computer storage media and communication media, where the communication media includes any media that facilitates the transfer of computer programs from one place to another place. The storage medium can be any available medium that can be accessed by a general-purpose or special-purpose computer.

The above is only illustrated embodiments of the present disclosure, and it is not used to limit the present disclosure. Any modification, equivalent substitution, improvement, etc. made within the spirit and principle of the present disclosure should be included in the protection scope of the present disclosure.

What is claimed is:

1. A touch scanning method, implemented to a touch panel driver integrated circuit (TPIC) chip of a display screen, wherein the method comprises:
    receiving an emission synchronization signal sent by a display driver integrated circuit (DDIC) chip, wherein the emission synchronization signal is synchronized with an emission (EM) signal controlled by the DDIC chip;
    receiving a vertical synchronization signal sent by the DDIC chip;
    determining an image scanning interval and a non-image scanning interval of the DDIC chip, based on the vertical synchronization signal;
    performing continuous touch scanning according to a touch scanning frequency with the emission synchronization signal as a synchronization reference, and obtaining a first touch signal in the image scanning interval and a second touch signal in the non-image scanning interval, wherein a time point of the touch scanning is aligned with a time point of the emission synchronization signal being received; and
    filtering the first touch signal and the second touch signal.

2. The method according to claim 1, wherein determining the image scanning interval and the non-image scanning interval of the DDIC chip based on the vertical synchronization signal, comprises:
    determining an image scanning duration based on a refresh rate of the display screen;
    determining a time interval of the image scanning duration after a current vertical synchronization signal as the image scanning interval; and
    determining a time interval between an end time of the image scanning interval and a next vertical synchronization signal as the non-image scanning interval.

3. The method according to claim 2, wherein determining the image scanning duration based on the refresh rate of the display screen, comprises:
    determining a scanning duration of a single frame image at a highest refresh rate of the display screen as the image scanning duration.

4. The method according to claim 1, wherein an interference of the DDIC chip on the TPIC chip within the image scanning interval is higher than that of the DDIC chip on the TPIC chip within the non-image scanning interval;
    wherein filtering the first touch signal and the second touch signal, comprises:
        filtering the first touch signal through a first filtering algorithm, and filtering the second touch signal through a second filtering algorithm, wherein the first filtering algorithm is different from the second filtering algorithm.

5. The method according to claim 1, wherein the touch scanning frequency is 1/k of an EM frequency, and the touch scanning frequency is greater than or equal to a refresh rate of the display screen, where k is a positive integer;
    wherein the touch scanning frequency is a non-integer multiple of the refresh rate of the display screen.

6. The method according to claim 1, wherein the method is implemented by a TPIC chip of an organic light-emitting diode (OLED) display screen, or the method is implemented by a TPIC chip of a display screen in a mobile terminal.

7. A touch scanning method, implemented by a DDIC chip of a display screen, wherein the method comprises:
    sending an emission synchronization signal to a TPIC chip in a working state, wherein the emission synchronization signal is synchronized with an EM signal, and the TPIC chip is configured to perform continuous touch scanning according to a touch scanning frequency with the emission synchronization signal as a synchronization reference; and
    sending a vertical synchronization signal to the TPIC chip, wherein the TPIC chip is configured to determine an image scanning interval and a non-image scanning interval of the DDIC chip based on the vertical synchronization signal, and filter a first touch signal in the image scanning interval and a second touch signal in the non-image scanning interval.

8. The method according to claim 7, wherein the method is implemented by a DDIC chip of an OLED display screen, or the method is implemented by a DDIC chip of a display screen of a mobile terminal.

9. A display module, wherein the display module comprises:
- a display screen, a DDIC chip and a TPIC chip, and the DDIC chip is electrically connected with the TPIC chip;
- wherein the DDIC chip is configured to send an emission synchronization signal to the TPIC chip; the emission synchronization signal is synchronized with an EM signal; and
- wherein the TPIC chip is configured to receive the emission synchronization signal, and perform continuous touch scanning according to a touch scanning frequency with the emission synchronization signal as a synchronization reference; and a time point of the touch scanning is aligned with a time point of the emission synchronization signal being received;
- wherein the DDIC chip is further configured to send a vertical synchronization signal to the TPIC chip, and the TPIC chip is further configured to:
  - receive the vertical synchronization signal;
  - determine an image scanning interval and a non-image scanning interval of the DDIC chip, based on the vertical synchronization signal;
  - perform the continuous touch scanning according to the touch scanning frequency with the emission synchronization signal as the synchronization reference, and obtain a first touch signal in the image scanning interval and a second touch signal in the non-image scanning interval; and
  - filter the first touch signal and the second touch signal.

10. The display module according to claim 9, wherein the TPIC chip is configured to:
- determine an image scanning duration based on a refresh rate of the display screen;
- determine a time interval of the image scanning duration after a current vertical synchronization signal as the image scanning interval; and
- determine a time interval between an end time of the image scanning interval and a next vertical synchronization signal as the non-image scanning interval.

11. The display module according to claim 10, wherein the TPIC chip is configured to determine a scanning duration of a single frame image at a highest refresh rate of the display screen as the image scanning duration.

12. The display module according to claim 9, wherein an interference of the DDIC chip on the TPIC chip within the image scanning interval is higher than that of the DDIC chip on the TPIC chip within the non-image scanning interval;
- wherein the TPIC chip is configured to:
  - filter the first touch signal through a first filtering algorithm, and filter the second touch signal through a second filtering algorithm, wherein the first filtering algorithm is different from the second filtering algorithm.

13. The display module according to claim 9, wherein the touch scanning frequency is 1/k of an EM frequency, and the touch scanning frequency is greater than or equal to a refresh rate of the display screen, where k is a positive integer; and the touch scanning frequency is a non-integer multiple of the refresh rate of the display screen.

14. The display module according to claim 9, wherein the display module is an OLED display module, and the DDIC chip is configured to drive the display screen to display images, and the TPIC chip is configured to collect touch operation signals on the display screen.

* * * * *